US009713285B2

(12) United States Patent
Cader et al.

(10) Patent No.: US 9,713,285 B2
(45) Date of Patent: Jul. 18, 2017

(54) ELECTRONIC APPARATUS HAVING A COOLING APPARATUS

(71) Applicant: Hewlett-Packard Development Company, L.P., Houston, TX (US)

(72) Inventors: Tahir Cader, Liberty Lake, WA (US); Niru Kumari, Palo Alto, CA (US); John Franz, Houston, TX (US); Cullen E. Bash, Palo Alto, CA (US); David A. Moore, Houston, TX (US); Sergio Escobar-Vargas, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 6 days.

(21) Appl. No.: 14/780,482

(22) PCT Filed: Mar. 29, 2013

(86) PCT No.: PCT/US2013/034691
§ 371 (c)(1),
(2) Date: Sep. 25, 2015

(87) PCT Pub. No.: WO2014/158196
PCT Pub. Date: Oct. 2, 2014

(65) Prior Publication Data
US 2016/0066472 A1    Mar. 3, 2016

(51) Int. Cl.
*H05K 7/20* (2006.01)
*F28D 15/02* (2006.01)
(Continued)

(52) U.S. Cl.
CPC ....... *H05K 7/20263* (2013.01); *F28D 15/025* (2013.01); *F28D 15/0266* (2013.01);
(Continued)

(58) Field of Classification Search
CPC .... F28D 15/025; F28D 15/0266; F28D 15/04; F28D 15/06; F28D 2021/0028;
(Continued)

(56) References Cited

U.S. PATENT DOCUMENTS 6,644,058 B2   11/2003   Bash et al.
6,973,801 B1   12/2005   Campbell et al.
(Continued)

FOREIGN PATENT DOCUMENTS

CN   100556260 C   10/2009
CN   102331203 A   1/2012
(Continued)

OTHER PUBLICATIONS

Beitelmal, M,H. et al., Model-based Approach for Optimizing a Data Center Centralized Cooling System, (Research Paper), Apr. 14, 2009, 21 Pages.
(Continued)

*Primary Examiner* — Anthony Haughton
*Assistant Examiner* — Yahya Ahmad
(74) *Attorney, Agent, or Firm* — Mannava & Kang, P.C.

(57) ABSTRACT

According to an example, a cooling system includes a cooling fluid reservoir, a cooling apparatus in fluid communication with the cooling fluid reservoir, a chamber having a side in thermal contact with a portion of the heat generating component, in which cooling fluid delivered by the cooling apparatus is to be heated through receipt of heat from the heat generating component, a cooling plate positioned at a distance and separated from the chamber, and a cooling fluid tube connecting the chamber and the cooling plate, in which the heated cooling fluid is to flow through the cooling fluid tube to the cooling plate. The cooling plate is also to be in thermal contact with a heat exchanger that that is to remove heat from the cooling fluid.

14 Claims, 6 Drawing Sheets

(51) Int. Cl.
*G06F 1/20* (2006.01)
*F28D 15/04* (2006.01)
*F28D 15/06* (2006.01)
*F28D 21/00* (2006.01)

(52) U.S. Cl.
CPC .............. *F28D 15/04* (2013.01); *F28D 15/06* (2013.01); *G06F 1/206* (2013.01); *H05K 7/20272* (2013.01); *H05K 7/20281* (2013.01); *H05K 7/20836* (2013.01); *F28D 2021/0028* (2013.01)

(58) Field of Classification Search
CPC  G06F 1/206; H05K 7/20263; H05K 7/20272; H05K 7/20281; H05K 7/20836
USPC ....... 361/688, 689, 699–704; 165/80.1–80.5, 165/104.11–104.34, 185
See application file for complete search history.

(56) References Cited

U.S. PATENT DOCUMENTS

| | | | |
|---|---|---|---|
| 7,167,778 B2 | 1/2007 | Yazawa et al. | |
| 7,315,448 B1 | 1/2008 | Bash et al. | |
| 8,018,720 B2 | 9/2011 | Campbell et al. | |
| 2002/0050144 A1* | 5/2002 | Patel | F25B 39/04 62/259.2 |
| 2004/0089008 A1* | 5/2004 | Tilton | F28D 5/00 62/259.2 |
| 2006/0117764 A1* | 6/2006 | Patel | F25B 23/006 62/121 |
| 2006/0117765 A1* | 6/2006 | Bash | F28D 5/00 62/121 |
| 2006/0162363 A1* | 7/2006 | Sharma | H01L 23/4735 62/259.2 |
| 2010/0128436 A1* | 5/2010 | Edmunds | H01L 23/427 361/700 |
| 2011/0198060 A1 | 8/2011 | Lange et al. | |
| 2013/0027883 A1* | 1/2013 | Campbell | H05K 7/20309 361/700 |
| 2014/0252864 A1* | 9/2014 | Kulkarni | H05K 7/20936 307/82 |

FOREIGN PATENT DOCUMENTS

| | | |
|---|---|---|
| CN | 102374807 A | 3/2012 |
| JP | 2007003108 A | 1/2007 |

OTHER PUBLICATIONS

International Searching Authority, The International Search Report and the Written Opinion, Dec. 17, 2013, 13 Pages.
CN First Office Action dated Oct. 27, 2016, CN Patent Application No. 201380075230.8 dated Mar. 29, 2013, State Intellectual Property Office of the P.R. China, 8 pages.

\* cited by examiner

ELECTRONIC APPARATUS HAVING A COOLING APPARATUS

BACKGROUND

Semiconductor devices are continually being developed to have ever increasing component densities. In addition, miniaturization of these devices has led to increasing power dissipation requirements. As a result, the removal of heat generated by these devices has also become an increasingly challenging technical issue. Cooling of these devices through use of boiling/vaporizing fluids has been identified as a suitable technique for cooling these devices.

BRIEF DESCRIPTION OF THE DRAWINGS

Features of the present disclosure are illustrated by way of example and not limited in the following figure(s), in which like numerals indicate like elements, in which.

DETAILED DESCRIPTION

Figure 1:
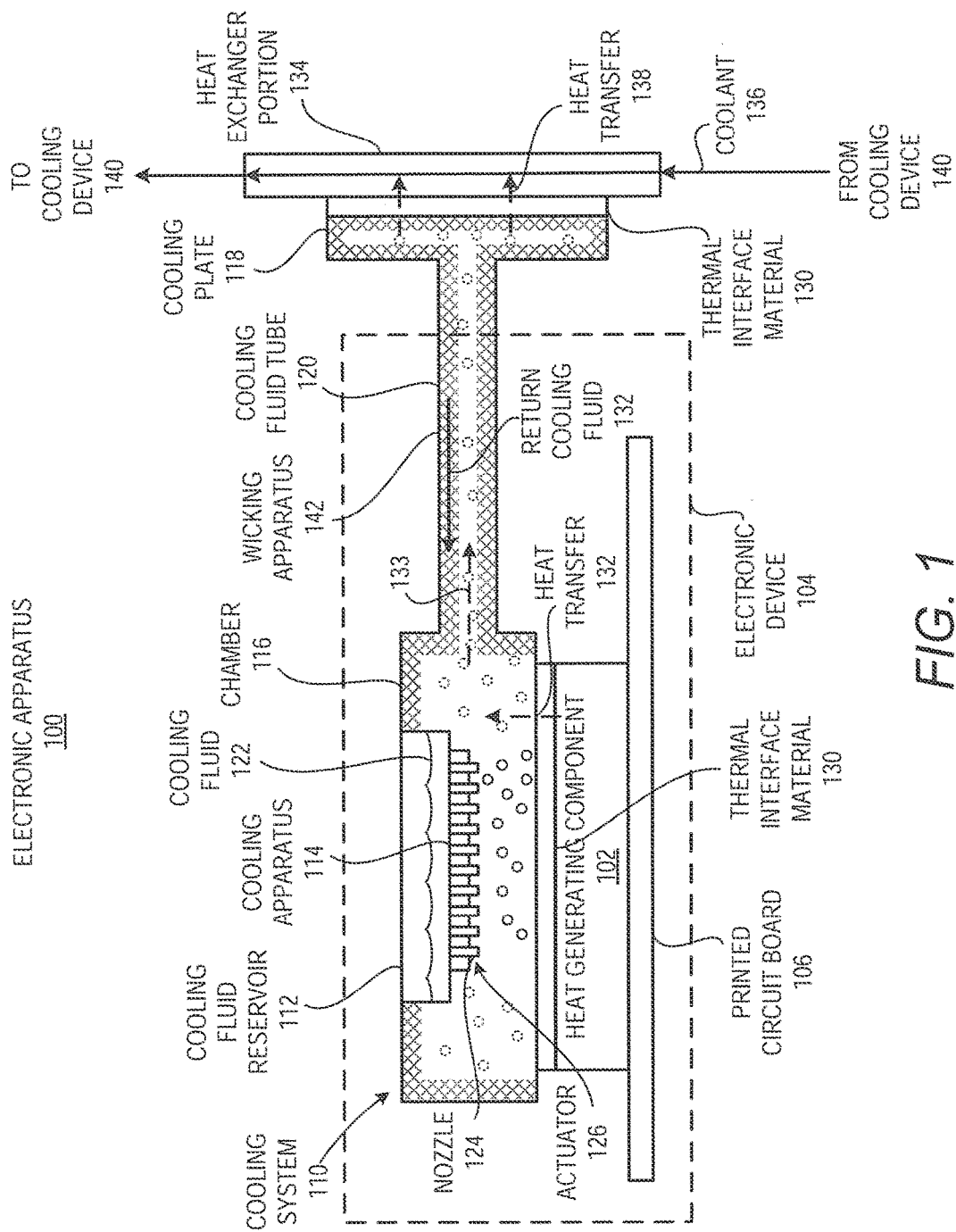
FIG. 1 depicts a simplified block diagram of a side view of an electronic apparatus, which may implement various features disclosed herein, according to an example of the present disclosure.

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the term "includes" means includes but not limited to, the term "including" means including but not limited to. The term "based on" means based at least in part on.

Disclosed herein are an electronic apparatus having a cooling system, a system to cool a heat generating component, and a method of cooling a plurality of heat generating components in an electronic apparatus. Particularly, disclosed herein is a cooling system that includes a cooling apparatus, e.g., an inkjet spraying apparatus, that may controllably deliver, dispense, or spray droplets of a cooling fluid to remove heat from a heat generating component. The cooling system also includes a cooling fluid tube that is connected to a cooling plate through which cooled cooling fluid is to flow. The cooling plate may be in thermal communication with a heat exchanger, such that the cooled cooling fluid is to be cooled through transfer of heat into the heat exchanger. The cooling plate may be positioned at a distance and may be separated from a chamber in which the cooling fluid is cooled and the cooling plate may be in fluid communication with the chamber through a cooling fluid tube. In one regard, this configuration enables portions of the cooling system that are in thermal contact with the heat generating component to have a relatively small footprint and to thus be useable in relatively densely packed electronic apparatuses. In addition, by enabling the cooling plate to be relatively freely moveable with respect to the cooling apparatus, relatively high levels of heat removal may be realized, for instance, through placement of the cooling plate in thermal contact with an active heat exchanger, e.g., an electronics cabinet level heat exchanger.

According to an example, the electronic apparatus includes a plurality of heat generating components and the cooling system includes a separate cooling apparatus for a number of the heat generating components. In one regard, because the cooling plates are separated from the cooling apparatuses, the heat generating components may be densely packed and have relatively small sizes, while still receiving cooling fluid from the cooling apparatuses. In addition, because the cooling apparatuses require relatively small amounts of cooling fluid, the cooling fluid tubes may have relatively small diameters. Furthermore, the cooling fluid tubes may be made of flexible material and thus, the cooling fluid tubes may be positioned around relatively tightly packed components contained in the electronic apparatus.

The cooling apparatuses, and particularly the firing mechanisms, e.g., actuators, may be controlled to optimize delivery of cooling fluid droplets as conditions, such as the required heat dissipation levels, change in the heat generating components. The optimized delivery of cooling fluid droplets may also result in minimization of energy consumption in higher level cooling systems, e.g., a rack level heat exchanger loop.

With reference first to FIG. 1, there is shown a simplified block diagram of a side view of an electronic apparatus 100, which may implement various features disclosed herein, according to an example. It should be understood that the electronic apparatus 100 may include additional elements and that some of the elements depicted therein may be removed and/or modified without departing from a scope of the electronic apparatus 100.

The electronic apparatus 100 may be any type of apparatus that includes a heat generating component 102. Examples of suitable types of electronic apparatuses 100 include, for instance, an electronics cabinet, a server, a blade server, a networking apparatus, a card within an electronic device, etc. In an example in which the electronic apparatus 100 is an electronics cabinet, such as an electronics rack or other type of structure that houses multiple computing and/or networking devices, the heat generating component 102 may be housed within an electronic device 104. In this example, the electronic device 104 may be a server, a networking apparatus, such as a switch, router, etc., a network card, etc.

The heat generating component 102 may be any type of component that generates or dissipates heat during operation thereof, such as a central processing unit, a graphics processing unit, a dual in-line memory module (DIMM), a single in-line memory module (SIMM), power conversion hardware (such as voltage regulator module components), etc. In one regard, therefore, the heat generating component 102 may be connected to a printed circuit board 106 through which the heat generating component 102 may receive power and communicate electronic signals. Although the electronic apparatus 100 has been depicted as including a single heat generating component 102, it should be readily understood that the electronic apparatus 100 may include any number of heat generating components 102 without departing from a scope of the electronic apparatus 100 disclosed herein. Thus, for instance, a plurality of heat generating components 102 may be positioned on the printed circuit board 106.

The electronic apparatus 100 may also include a cooling system 110, as shown in FIG. 1. The cooling system 110 may include a cooling fluid reservoir 112, a cooling apparatus 114, a chamber 116, a cooling plate 118, and a cooling fluid tube 120. Portions of the cooling system 110 may be contained within or adjacent to the electronic device 104, while other portions of the cooling system 110 may be positioned outside of or remote from the electronic device 104. As shown in FIG. 1, the cooling plate 118 and a portion of the cooling fluid tube 120 are positioned outside of the electronic device 104.

According to an example, the cooling apparatus 114 is in fluid communication with the cooling fluid reservoir 112, which is depicted as including a cooling fluid 122. Particularly, the cooling apparatus 114 may include a plurality of nozzles 124, for instance, in a nozzle plate, and a plurality of actuators 126 (which is beneath the nozzle and not visible in FIG. 1) to deliver, e.g., dispense, spray, etc., cooling fluid 122 from the cooling fluid reservoir 112 onto a side of the chamber 116 that is in thermal contact with the heat generating component 102. Although the cooling apparatus 114 has been depicted as being directly connected to the cooling fluid reservoir 112, the cooling apparatus 114 may instead be connected through fluid tubes (not shown) to the cooling fluid reservoir 112. Thus, for instance, the cooling fluid reservoir 112 may supply cooling fluid 122 to a plurality of cooling apparatuses 114.

According to an example, the actuators 126 of the cooling apparatus 114 may be any suitable type of actuator 126 used, for instance, in the printing of ink. Thus, for instance, the actuators 126 may be any of heating elements, piezoelectric elements, pumping elements, etc., that are to cause relatively small droplets of the cooling fluid 122 to be expelled through the nozzles 124 in a substantially controlled manner. By way of particular example in which the actuator 126 is a thermal inkjet type of actuator, a predetermined portion of the cooling fluid 122 may be received into an ejection chamber (not shown). The thermal inkjet actuator, upon being energized, becomes heated and vaporizes a portion of the cooling fluid 122 in the ejection chamber, causing the vaporized cooling fluid 122 to expand, which causes the non-vaporized cooling fluid 122 to be expelled out of the ejection chamber through a nozzle 124. The expelled cooling fluid 122 is typically in the form of a single droplet.

According to an example, the cooling fluid 122 is a fluid that has a relatively low boiling point, for instance, in relation to the operating temperature of the heat generating component 102, which is the temperature to which the heat generating component 102 may be cooled. By way of example, the cooling fluid 122 may be FLUORINERT, which may be available from the 3M Corporation, the Novec line of fluids (HFE 7100, etc.), PF-5060, which may also be available from the 3M Corporation, etc. In addition, the boiling point of the cooling fluid 122 may be adjusted by, for instance, lowering the operating pressure of the cooling fluid 122 to a partial vacuum.

In any regard, the cooling apparatus 114 is depicted as delivering cooling fluid 122 in the form of droplets onto a side of the chamber 116 that is in thermal contact with the heat generating component 102. The side of the chamber 116 that is in thermal contact with the heat generating component 102 may be composed of a material and may have a relatively small thickness to provide little thermal resistance for heat dissipated by the heat generating component 102. In addition, a thermal interface material 130 may be placed between the heat generating component 102 and the side of the chamber 116 to enhance thermal conduction from the heat generating component 102 and the side of the chamber 116. Thus, for instance, the terms "thermal contact" may include instances in which there is either direct or indirect physical contact between elements so long as there is thermal conduction between the elements. In other examples, however, the side of the chamber 116 that is in thermal contact with the heat generating component 102 may be omitted to thereby enable direct spraying of the cooling fluid 122 onto a surface of the heat generating component 102.

As also shown in FIG. 1, as droplets of cooling fluid 122 (as represented by the solid circles) are delivered onto the side of the chamber 116, heat from the heat generating component 102 is received or absorbed by the droplets of cooling fluid 122 as denoted by the arrow 132. As the droplets of cooling fluid 122 absorb the heat, the droplets of cooling fluid 122 become heated and may vaporize (as represented by the dotted circles). In addition, as the droplets of cooling fluid 122 become heated and vaporize, pressure within the chamber 116 increases, creating a pressure differential within the apparatus which may force some of the heated cooling fluid 122 toward the cooling plate 118 through the hollow central portion of cooling fluid tube 120, as indicated by the arrow 133. According to an example, the cooling plate 118 may be positioned at a relatively higher height as compared to the chamber 116, which may further facilitate movement of the heated cooling fluid 122 toward the cooling plate 118 since the heated cooling fluid 122 may be at a relatively higher temperature as compared to the non-heated cooling fluid 122. In another example, the cooling system 110 includes a plurality of separate cooling plates 118 that are in fluid communication with the chamber 116 through respective cooling fluid tubes 120.

The cooling plate 118 may be in thermal contact with a portion of a heat exchanger 134, as also depicted in FIG. 1. In addition, a thermal interface material 130 may be provided between the cooling plate 118 and the portion of the heat exchanger 134 to facilitate transfer of heat from the cooling fluid 122 into a coolant 136 flowing through the heat exchanger 134. As shown in FIG. 1, the coolant 136 may absorb heat from the heated cooling fluid 122 contained in the cooling plate 118, as indicated by the arrow 138. In addition, the coolant 136 may flow away from the portion of the heat exchanger 134 at which the heat transfer 138 occurred. The coolant 136 may be any suitable type of fluid to absorb heat from the cooling fluid 122 and to convey the absorbed heat away. According to a particular example, the coolant 136 is chilled water, a refrigerant, a gas, etc. Moreover, the heated coolant 136 may be delivered to a cooling device 140 (not shown), which may include a chiller, a compressor, a condenser, etc., that is to remove heat from the coolant 136 and thereby cool the coolant 136 prior to the coolant 136 being supplied back through the exchanger portion 134. In one regard, the heat exchanger portion 134 may be part of a closed loop cooling arrangement that is separate from the chamber 116 and the cooling plate 118. That is, the coolant 136 contained in the closed loop cooling arrangement of the heat exchanger portion 134 and the cooling device 140 may be physically separated from the cooling fluid 122.

According to an example, the closed loop cooling arrangement may include a plurality of heat exchanger portions 134 at which heat is transferred from cooling fluid contained in multiple cooling plates 118. In addition, the amount of heat transferred into the coolant 136 flowing through the heat exchanger portion(s) 134 may be adjusted through, for instance, control of the rate at which the coolant 136 flows through the heat exchanger portion(s) 134, control of the temperature of the coolant 136, the type of coolant 136 used, etc. Thus, for instance, the temperature and/or flow rate of the coolant 136 may be varied as load conditions change in the electronic apparatus 100. According to an example, a controller (not shown) may control the temperature and/or flow rate of the coolant 136 to substantially minimize the amount of energy required to maintain the heat generating component(s) 102 within a predetermined range of temperatures. Thus, for instance, the controller may control the cooling device 140 to maintain the coolant 136 at the highest possible temperature while still providing adequate cooling to maintain the heat generating component 102 within a predetermined temperature range. In another example, the controller may control the cooling device 140 to maximize coolant 136 return temperature, for instance, for re-use of the heat from the coolant 136 in a building heating system. In further examples, the controller may control the cooling device 140 to minimize an operating temperature of a heat generating component 102, provide uniform temperature across multiple heat generating components 102, minimize total cooling system energy consumption, etc.

In other examples, the heat exchanger portion 134 may be, a heat generating component that does not include a coolant 136 flowing therethrough. In these examples, the heat exchanger portion 134 may include a plurality of fins (not shown) through which heat may be dissipated. The heat exchanger portion 134 in this example may also include a fan to force airflow over the fins and thus increase heat dissipation.

As the heat is transferred from the heated cooling fluid 122 either to the coolant 136 or through other heat transfer, the heated cooling fluid 122 may be cooled and may condense into a liquid. In the example depicted in FIG. 1, inner surfaces of the cooling plate 118, the cooling fluid tube 120, and the chamber 116 include a wicking apparatus 142 that is to wick the cooled cooling fluid 122 to the cooling fluid reservoir 112. The wicking apparatus 142 may include any suitable type of wicking apparatus conventionally implemented to wick fluid from one location to another. In addition, or alternatively to the wicking apparatus 142, a pumping mechanism may be implemented to convey the cooling fluid 112 in liquid form from the cooling plate 118 to the cooling fluid reservoir 112. As a further example, activation of the actuators 126 in the cooling apparatus 114 may create fluid pressure that may be sufficient to draw at least some of the cooling fluid 122 from the cooling plate 118 to the cooling fluid reservoir 112. In any regard, the cooling system 110 may be an enclosed system in which the cooling fluid 112 may be sealed from an environment outside of the cooling system 110. In addition, the cooling system 110 may be at a partial vacuum to reduce the boiling point of the cooling fluid 122.

Figure 2:
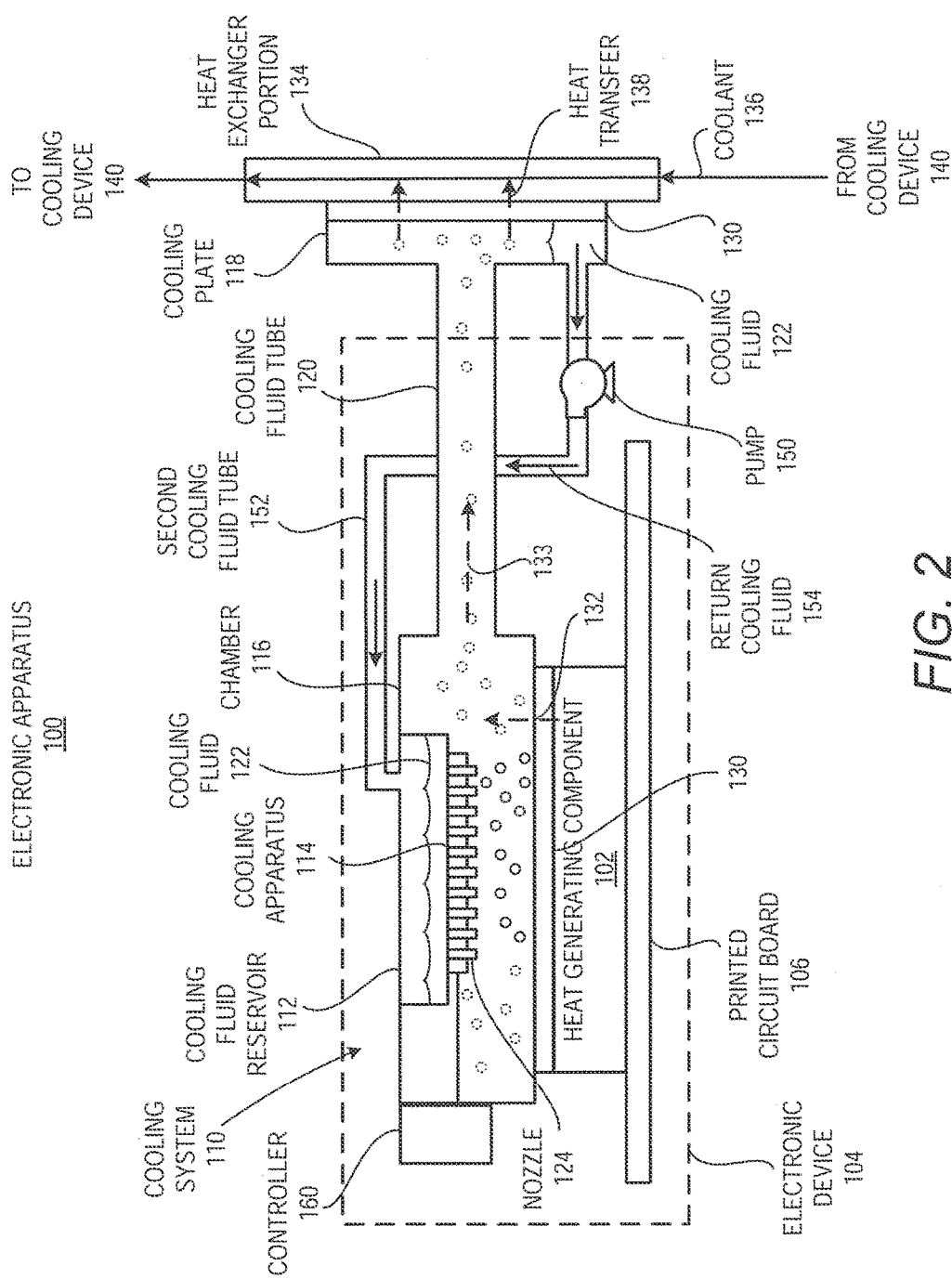
FIG. 2 depicts a simplified block diagram of a side view of the electronic apparatus depicted in FIG. 1, according to another example of the present disclosure.

Turning now to FIG. 2, there is shown a simplified block diagram of a side view of the electronic apparatus 100 depicted in FIG. 1, according to another example. Particularly, the electronic apparatus 100 depicted in FIG. 2 includes most of the same elements as those depicted in FIG. 1, except that the electronic apparatus 100 depicted in FIG. 2 includes a pump 150 and a second cooling fluid tube 152. As such, descriptions of the components that are common to both FIGS. 1 and 2 will not be described again with respect to FIG. 2.

As shown in FIG. 2, as the heated cooling fluid 122 cools in the cooling plate 118, the cooling fluid 122, in liquid form, may collect at a bottom of the cooling plate 118. The second cooling fluid tube 152 may include an opening that is in fluid communication with the bottom of the cooling plate 118 to enable the cooling fluid 112 in liquid form to be pumped out of the cooling plate 118. The pump 150 may also force the cooling fluid 112 in liquid form through the second cooling fluid tube 152 and to be delivered to the cooling fluid reservoir 112 as shown by the arrows 154. The pump 150 may be any suitable type of pump 150 that may be of sufficiently small size to fit within the electronic apparatus 100, while also generating sufficient pressure to pump the cooling fluid 122 from the cooling plate 118 to the cooling fluid reservoir 112. In any regard, the cooling system 110 may be an enclosed system in which the cooling fluid 112 may be sealed from an environment outside of the cooling system 110.

Also shown in FIG. 2 is a controller 160 that may control operations of the nozzles 124. The controller 160 may also control operations of other components of the electronic apparatus 100, such as the pump 150, other cooling apparatuses, etc. Alternatively, however, a separate controller (not shown) may control the pump 150. In any regard, the controller 160 may be a microprocessor, a micro-controller, an application specific integrated circuit (ASIC), or the like. According to an example, the controller 160 may control the actuators 126 in the cooling apparatus 114 to control the rates at which droplets of the cooling fluid 122 are delivered, e.g., sprayed, through the nozzles 124. For instance, the controller 160 may increase the rates at which the droplets of cooling fluid 122 are delivered in response to increased heat dissipation by the heat generating component 102. Likewise, the controller 160 may decrease the rates at which the droplets of cooling fluid 122 are delivered in response to decreased heat dissipation by the heat generating component 102. By way of particular example, the controller 160 may control the rate at which the droplets of the cooling fluid 122 are delivered to maintain the heat generating component 102 with a predetermined temperature range without substantially causing the cooling fluid 122 to pool on the bottom of the chamber 116.

In addition, or alternatively, the controller 160 may control individual ones or groups of actuators 126 in the cooling apparatus 114 to deliver droplets of the cooling fluid 122 at different rates and/or at different times with respect to each other. In this example, the controller 160 may cause the droplets to be delivered to cool different areas of the heat generating component 102 at different rates and/or at different times. In one regard, if there is a flux in the heat dissipated from different locations of the heat generating component 102, the controller 160 may compensate for that heat flux through application of different amounts of cooling to the different locations. As such, for instance, the cooling system 110 may substantially prevent local hot spots from forming in the heat generating component 102.

Figure 3:
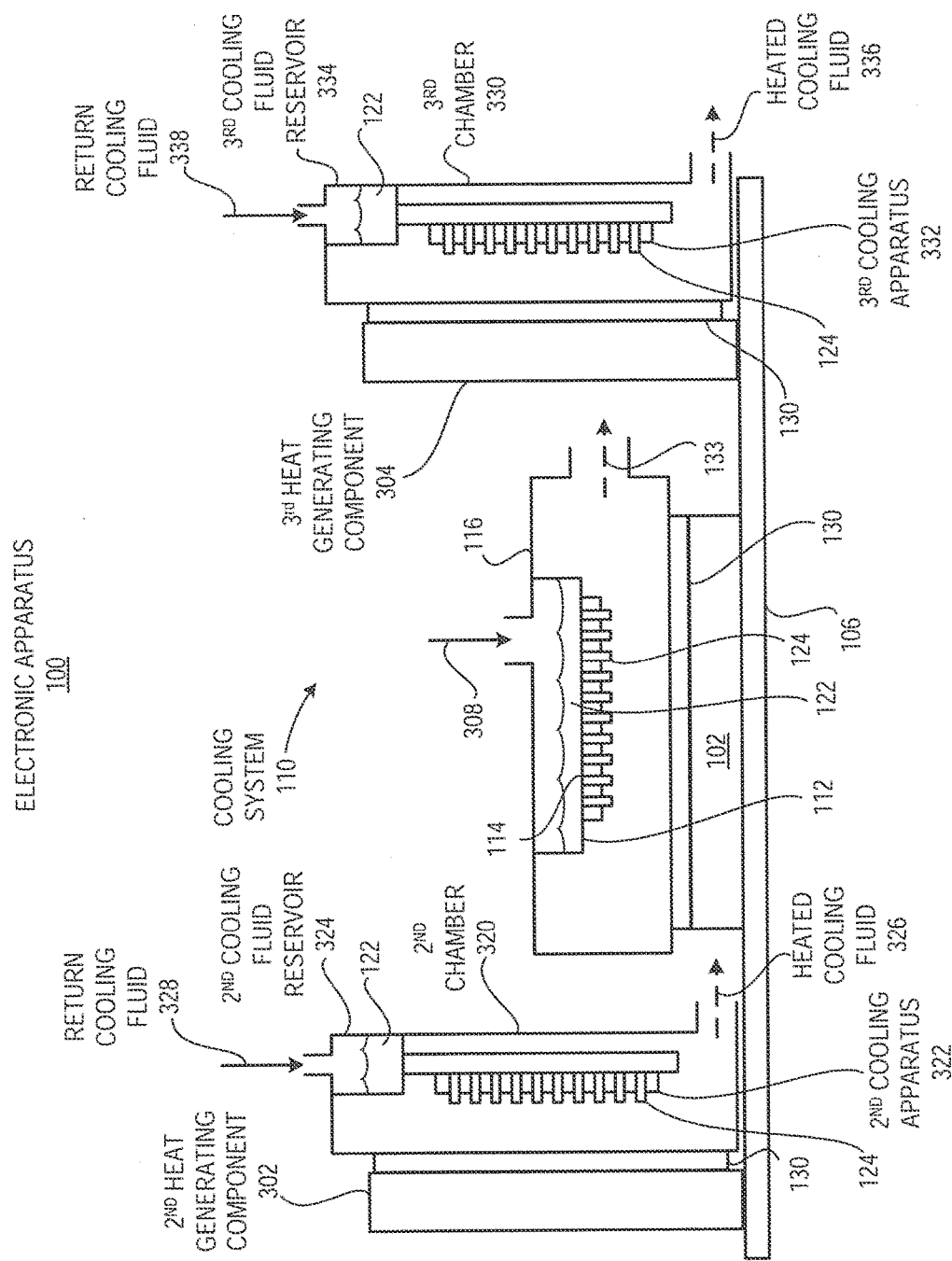
FIG. 3 depicts a simplified block diagram of the electronic apparatus depicted in FIG. 1, according to a further example of the present disclosure.

Turning now to FIG. 3, there is shown a simplified block diagram of the electronic apparatus 100 depicted in FIG. 1, according to another example. Particularly, the electronic apparatus 100 depicted in FIG. 3 includes most of the same elements as those depicted in FIG. 1, except that the electronic apparatus 100 is depicted as including multiple heat generating components 102, 302, and 304. In addition, the cooling system 110 is depicting as having a separate cooling apparatus 114, 322, 332 for each of the heat generating components 102, 302, 304. According to an example, the heat generating component 102 is a CPU, GPU, or the like, and the second and third heat generating components 302, 304 are memory modules, such as DIMMs, SIMMs, power conversion hardware, or the like. It should be understood that FIG. 3 depicts a generalized illustration of the electronic apparatus 100 and that additional features have been omitted for purposes of simplicity. For instance, cooling fluid tubes 120 or second cooling fluid tubes 152 connecting the chambers 116, 320, 330 to a cooling plate(s) 118 have not been depicted in FIG. 3. As such, the arrows 326, 328, 133, 308, 336, 338 representing the flow of the cooling fluid between the respective chambers 116, 320, 330 and the cooling plate(s) 118 should be construed as flowing through various cooling fluid tubes 120 and/or 152.

Similarly to FIG. 1, in FIG. 3, the heat generating component 102 is depicted as being in thermal contact with the chamber 116 through the thermal interface material 130. In addition, the cooling apparatus 114 is depicted as supplying cooling fluid 122 from the cooling fluid reservoir 112 onto a side of the chamber 116 that is in thermal contact with the heat generating component 102. Heated cooling fluid 122 is also depicted as flowing out of the chamber 116 by an arrow 133. As discussed above, the heated cooling fluid may flow toward the cooling plate 118 through a cooling fluid tube 120 and may be cooled in the cooling plate 118. The cooled cooling fluid may return to the cooling fluid reservoir 112 as indicated by the arrow 308, for instance, through the cooling fluid tube 120 and/or the second cooling fluid tube 152, as also discussed above. Thus, although not shown in FIG. 3, it should be understood that the chamber 116 may be fluid communication with the cooling plate 118 in any of the manners discussed above with respect to FIGS. 1 and 2. In addition, it should be understood that the cooling plate 118 may be in thermal contact with the heat exchanger portion 134, as also discussed above.

As shown in FIG. 3, the second heat generating component 302 may be in thermal contact with a side of a second chamber 320 through a thermal interface material 130. In addition, a second cooling apparatus 322 may be in fluid communication with a second cooling fluid reservoir 324 containing cooling fluid 122. The second cooling apparatus 322 may operate in similar manners to the cooling apparatus 114 discussed above with respect to FIGS. 1 and 2. However, the second cooling apparatus 322 may differ from the cooling apparatus 114 in that the second cooling apparatus 322 may deliver droplets of cooling fluid 122 in a substantially horizontal direction. That is, the second cooling apparatus 322 may deliver droplets of cooling fluid 122 in a direction that is perpendicular to the direction in which the cooling apparatus 114 may deliver droplets of cooling fluid 112 to cool the heat generating component 102.

In any regard, the droplets of cooling fluid 122 delivered to cool the second heat generating component 302 may be heated through absorption of heat from the second heat generating component 302. In addition, the heated cooling fluid 326 may flow toward a cooling plate 118 in similar manners to those as discussed above with respect to the cooling fluid heated in the chamber 116 in FIGS. 1 and 2. In one example, the second chamber 320 may be in fluid communication with the cooling plate 118 to which the chamber 116 is in fluid communication, for instance, through a cooling fluid tube 120 (FIG. 1). In this example, cooling fluid 122 cooled in the cooling plate 118 may be returned, as indicated by the arrow 328, from the cooling plate 118 in any of the manners discussed above.

In another example, the second chamber 320 may be in fluid communication with a second cooling plate (not shown), for instance, through a cooling fluid tube. The second cooling plate may be in thermal contact with the heat exchanger portion 134 in any of the manners discussed above with respect to the cooling plate 118 to enable heat to be transferred from the heated cooling fluid 326 to the coolant 136 flowing through the heat exchanger portion 134. In this example, the return cooling fluid 328 may be returned from the second cooling plate in any of the manners discussed above with regard to the return of cooled cooling fluid 122 to the cooling fluid reservoir 112. For instance, the cooled cooling fluid 122 may be returned through a cooling fluid tube through which the heated cooling fluid was delivered to the second cooling plate. In another example, the cooled cooling fluid 122 may be returned through a second cooling fluid tube connecting the second cooling plate to the second cooling fluid reservoir 324.

As also shown in FIG. 3, the third heat generating component 304 may be in thermal contact with a side of a third chamber 330 through a thermal interface material 130. In addition, a third cooling apparatus 332 may be in fluid communication with a third cooling fluid reservoir 334 containing cooling fluid 122. The third cooling apparatus 332 may operate in similar manners to the second cooling apparatus 322 and the cooling apparatus 114 discussed above. The third cooling apparatus 332 may also deliver droplets of cooling fluid 122 in a direction that is perpendicular to the direction in which the cooling apparatus 114 may deliver droplets of cooling fluid 112 to cool the heat generating component 102.

As with the second heat, generating component 302, the droplets of cooling fluid 122 delivered to cool the third heat generating component 304 may be heated through absorption of heat from the third heat generating component 304. In addition, the heated cooling fluid 336 may flow toward a cooling plate 118 as discussed above with respect to FIGS. 1 and 2, for instance, through a cooling fluid tube. In one example, the third chamber 330 may be in fluid communication with the cooling plate 118 to which the chamber 116 (and, in one example, the second chamber 320) is in fluid communication. In this example, cooling fluid 122 cooled in the cooling plate 118 may be returned, as indicated by the arrow 338, from the cooling plate 118 in any of the manners discussed above, for instance, through a cooling fluid tube or a second cooling fluid tube.

In another example, the third chamber 330 may be in fluid communication with a third cooling plate (not shown). The third cooling plate may be in thermal contact with the heat exchanger portion 134 in any of the manners discussed above with respect to the cooling plate 118 to enable heat to be transferred from the heated cooling fluid 336 to the coolant 136 flowing through the heat exchanger portion 134. In this example, the return cooling fluid 338 may be returned from the third cooling plate in any of the manners discussed above with regard to the return of cooled cooling fluid 122 to the cooling fluid reservoir 112. For instance, the cooled cooling fluid 122 may be returned through a cooling fluid tube through which the heated cooling fluid was delivered to the third cooling plate. In another example, the cooled cooling fluid 122 may be returned through a second cooling fluid tube connecting the third cooling fluid reservoir 334 to the third cooling plate.

In any of the examples above, a controller (not shown) similar to the controller 160 depicted in FIG. 2 may be provided to respectively control the second cooling apparatus 322 and the third cooling apparatus 332. Alternatively, the controller 160 may control each of the cooling apparatuses 112, 322, 332.

In any of the examples above, the cooling fluid tubes connecting the various chambers 116, 320, 330 and the cooling plate(s) 118 and or the cooling fluid reservoirs 112, 324, 334 may follow a relatively circuitous path around other components of the electronic apparatus 100. Thus, for instance, the cooling fluid tubes may be formed of flexible tubing material, such as a flexible plastic, rubber, etc. In one regard, the cooling system 110 disclosed herein may generally enable the components of the electronic apparatus 100 to be arranged in a relatively dense configuration while enabling sufficient heat removal from the components.

Figure 4:
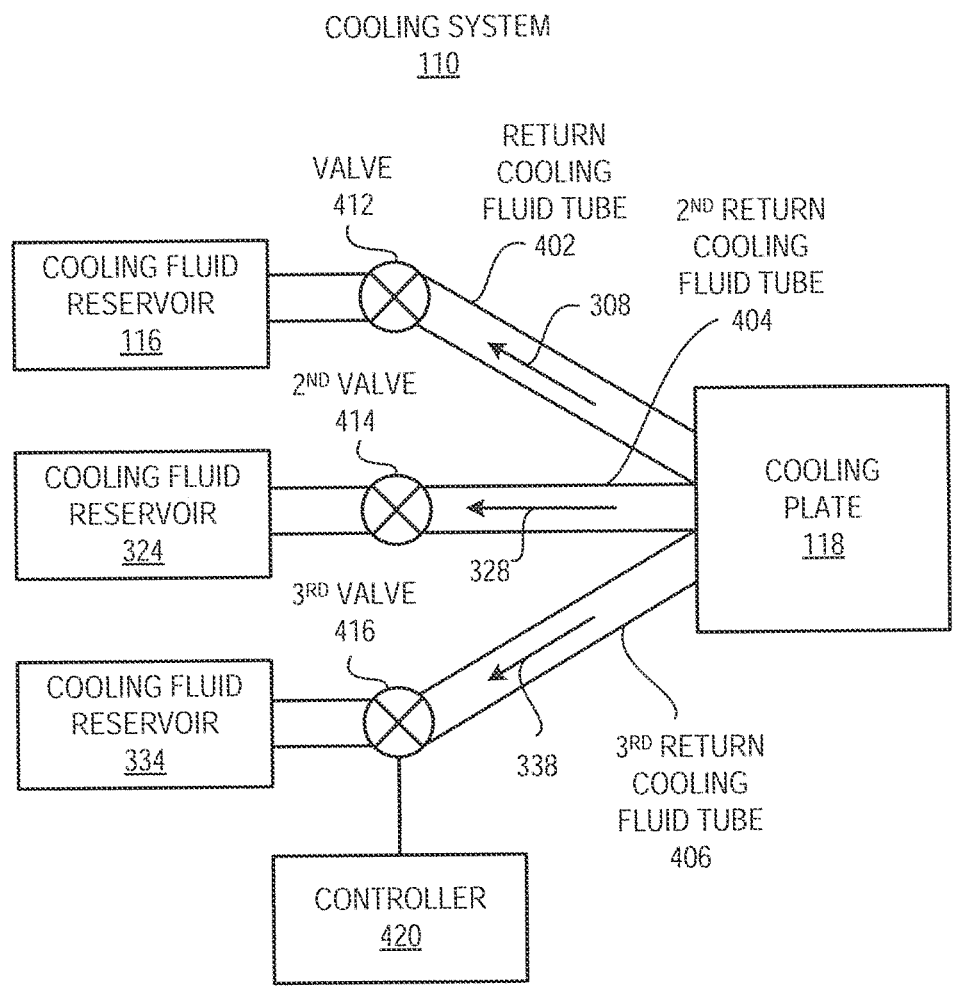
FIG. 4 shows a simplified block diagram of the cooling system depicted in FIG. 3, according to an example of the present disclosure.

Turning now to FIG. 4, there is shown a simplified block diagram of the cooling system 110 depicted in FIG. 3, according to an example. Particularly, FIG. 4 depicts a configuration in which the each of the cooling fluid reservoirs 116, 324, 334 receives cooled cooling fluid 308, 328, 338 from the same cooling plate 118 through respective cooling fluid tubes 402, 404, 406. In addition, the flow of the return cooling fluid into each of the cooling fluid reservoir 116, 324, 334 may be metered or controlled by a respective valve 412, 414, 416.

The valves 412, 414, 416 may enable the amount of cooled cooling fluid that is returned to the respective reservoirs 116, 324, 334 to be controlled, such that, for instance, each of the reservoirs 116, 324, 334 contains an adequate amount of cooling fluid 122 at any given time. According to an example, the valves 412, 414, 416 may be automatically actuating valves that are to open when the cooling fluid 122 level in a respective reservoir 116, 324, 334 falls below a predetermined level. In another example, the valves 412-416 may be automatically actuating valves that are to close when the cooling fluid 122 level in a respective reservoir 116, 324, 334 exceeds a predetermined level. In either of these examples; actuators 126 in the valves 412-416 may be connected to devices in the respective cooling fluid reservoirs 116, 324, 334 that measure or indicate the cooling fluid level and automatically control the valves 412-416 depending upon the cooling fluid level. As such, therefore, the cooling fluid 122 to be delivered by each of the cooling apparatuses 112, 322, 332 may be replenished as needed.

According to another example, the valve(s) 412-416 may be controlled by a controller 420, which may be a microprocessor, a micro-controller, an application specific integrated circuit (ASIC), or the like. The controller 420 may determine, for instance, the levels of cooling fluid 122 contained in each of the cooling fluid reservoirs 116, 324, 334 through receive of data from a sensor(s) (not shown) in the cooling fluid reservoirs 116, 324, 334. The controller 420 may also vary the openings of the valve(s) 412-416 based upon the determination to ensure that each of the cooling fluid reservoirs 116, 324, 334 contain sufficient amounts of cooling fluid 122.

Figure 5:
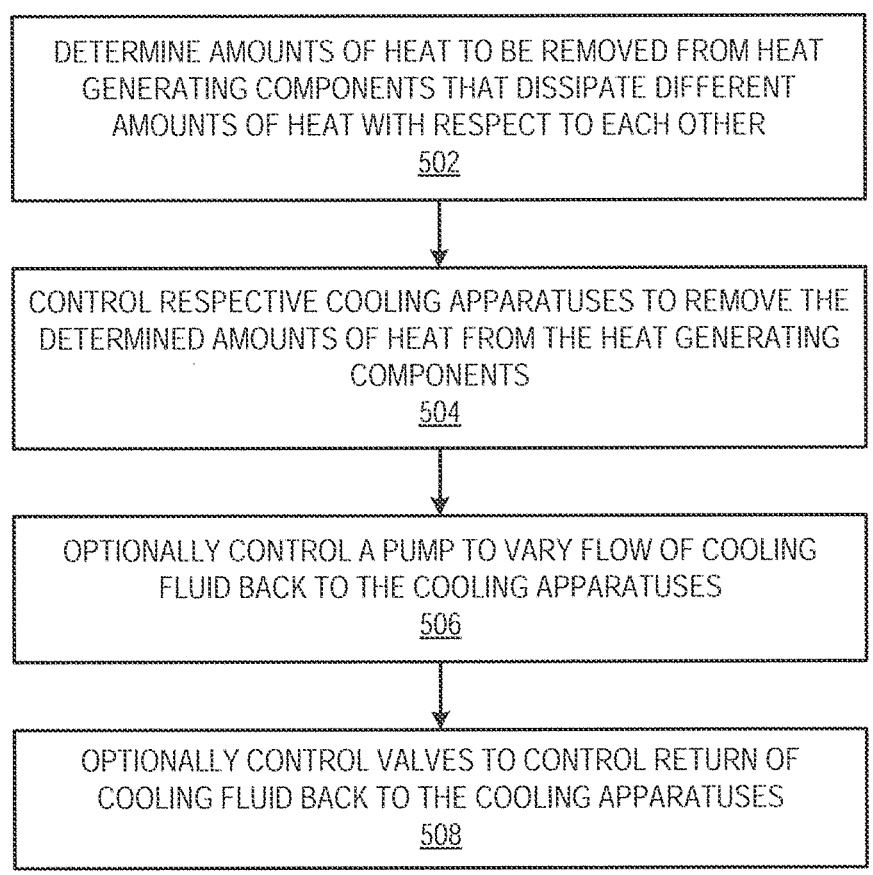
FIG. 5 shows a flow diagram of a method of cooling a plurality of heat generating components, according to an example of the present disclosure.

Turning now to FIG. 5, there is shown a flow diagram of a method 500 of cooling a plurality of heat generating components 102, 302, 304 in an electronic apparatus 100 using a plurality' of cooling apparatuses 114, 322, 332, according to an example. It should be apparent to those of ordinary skill in the art that the method 500 represents a generalized illustration and that other operations may be added or existing operations may be removed, modified or rearranged without departing from a scope of the method 500. In addition, although particular reference is made herein to the electronic apparatus 100 depicted in FIGS. 3 and 4, it should be understood that the method 500 may be implemented in electronic apparatuses having other configurations.

At block 502, the amounts of heat that are to be respectively removed from each of the plurality of heat generating components 102, 302, 304 may be determined. By way of example, a controller, such as the controller 160 (FIG. 2) or a separate controller, computer, or server, may make this determination for each of the heat generating components 102, 302, 304. In another example, separate controllers may make this determination for each of the heat generating components 102, 302, 304. In addition, this determination may be made in any of a number of suitable manners. For instance, the controller may determine the workloads on each of the heat generating components 102, 302, 304 and may calculate the amounts of heat each of the heat generating components 102, 302, 304 is likely to dissipate based upon the workloads. In this example, the controller may determine the workloads from information obtained from, for instance, a workload placement controller.

In another example, the heat generating components 102, 302, 304 may be equipped with internal temperature sensors to detect their temperatures and may communicate the detected temperatures to the controller. In a further example, the heat generating components 102, 302, 304 may be programmed with machine readable instructions to determine their temperatures, such as machine readable instructions that are to calculate temperatures of the heat generating components 102, 302, 304 based upon the number of operations that they are performing. In this example, the heat generating components 102, 302, 304 may predict future temperatures, for instance, based upon the amount of work that the heat generating components 102, 302, 304 are predicted to perform in the future. In a yet further example, external temperature sensors may be positioned on or near the heat generating components 102, 302, 304, for instance, on a surface of the chamber 116, 320, 330, and their detected temperatures may be communicated to the controller.

At block 504, the cooling apparatuses 114, 322, 332 may be separately controlled to respectively deliver droplets of cooling fluid to remove the determined amounts of heat from each of the heat generating components 114, 302, 304 without substantially causing the cooling fluid to pool beneath the cooling apparatuses 114, 322, 332. That is, the actuators 126 of the cooling apparatuses 114, 322, 332 are controlled to dispense or deliver droplets of cooling fluid 122, in which the amount and/or rate at which the droplets of cooling fluid 122 is delivered is such that substantially all of the droplets, e.g., more than about 90% of the droplets, evaporate upon absorption of the heat dissipated from the heat generating components 114, 302, and 304. In other examples, the substantially all of the droplets that are evaporated may be more than about 95% of the droplets. According to an example, a correlation between the amount of cooling fluid droplets required to remove different amounts of heat from the heat generating components 102, 302, 304 may have previously been made. In addition, the controller may have access to that correlation and may thus control the cooling apparatuses 114, 322, 332 to deliver respective amounts of cooling fluid corresponding to the amounts of heat dissipated by the heat generating components 102, 302, 304.

In other examples, the controller(s) may control the cooling apparatuses 114, 322, 332 to continuously deliver a predetermined amount of cooling fluid droplets depending upon the operating levels of the respective heat generating components 102, 302, 304. Thus, for instance, if the heat generating component 102 is operating at a higher level, the controller(s) may control the cooling apparatus 114 to deliver greater amounts of cooling fluid. In any regard, the cooling apparatuses 114, 322, 332 may be operated independently of each other to thus enable independent levels of heat removal from heat generating components 102, 302, 304.

At block 506, a pump may optionally be controlled to vary flow of cooling fluid back to the cooling apparatuses 114, 322, 332 such that each of the cooling apparatuses 114, 322, 332 has access to sufficient amounts of cooling fluid to remove the determined amounts of heat from each of the plurality of heat generating components. Block 506 may be optional because a pump, such as pump 150 (FIG. 2), may be set to be active whenever the cooling system 110 is operational. Alternatively, however, the pump may be controlled in an active manner to operate as needed to supply the cooling apparatuses 114, 322, 332 with sufficient cooling fluid, which may minimize the amount of energy consumed in returning cooling fluid from the cooling plate 118 to the cooling apparatuses 114, 322, 332. In addition, according to an example, a respective pump may be provided along the return cooling fluid tube to each of the cooling apparatuses 114, 322, 332, to thus afford greater control and flexibility on the return of the cooling fluid.

At block 508, valves 412, 414, 416 (FIG. 4) positioned along respective return fluid tubes to the cooling apparatuses 114, 322, 332 may optionally be controlled to control return of cooling fluid back to the cooling apparatuses 114, 322, 332. Block 508 may be optional because the valves 412, 414, 416 may be automatically controllable valves that may open when the cooling fluid levels in the respective reservoirs 112, 324, 334 of the cooling apparatuses 114, 322, 332 fall below a certain level. Alternatively, the valves 412, 414, 416 may remain open until the cooling fluid levels in the respective reservoirs 112, 324, 334 exceed a certain level. As a further alternative, a controller may individually control the valves 412, 414, 416 to substantially ensure that the reservoirs 112, 324, 334 have sufficient levels of cooling fluid for the cooling apparatuses 114, 322, 332.

Some or all of the operations set forth in the method 500 may be contained as a utility, program, or subprogram, in any desired computer accessible medium. In addition, the methods 500 may be embodied by computer programs, which may exist in a variety of forms both active and inactive. For example, they may exist as machine readable instructions, including source code, object code, executable code or other formats. Any of the above may be embodied on a non-transitory computer readable storage medium.

Examples of non-transitory computer readable storage media include dynamic random access memory (DRAM), electrically erasable programmable read-only memory (EEPROM), magnetoresistive random access memory (MRAM), Memristor, flash memory, floppy disk, a compact disc read only memory (CD-ROM), a digital video disc read only memory (DVD-ROM), or other optical or magnetic media, and the like. It is therefore to be understood that any electronic device capable of executing the above-described functions may perform those functions enumerated above.

Figure 6:
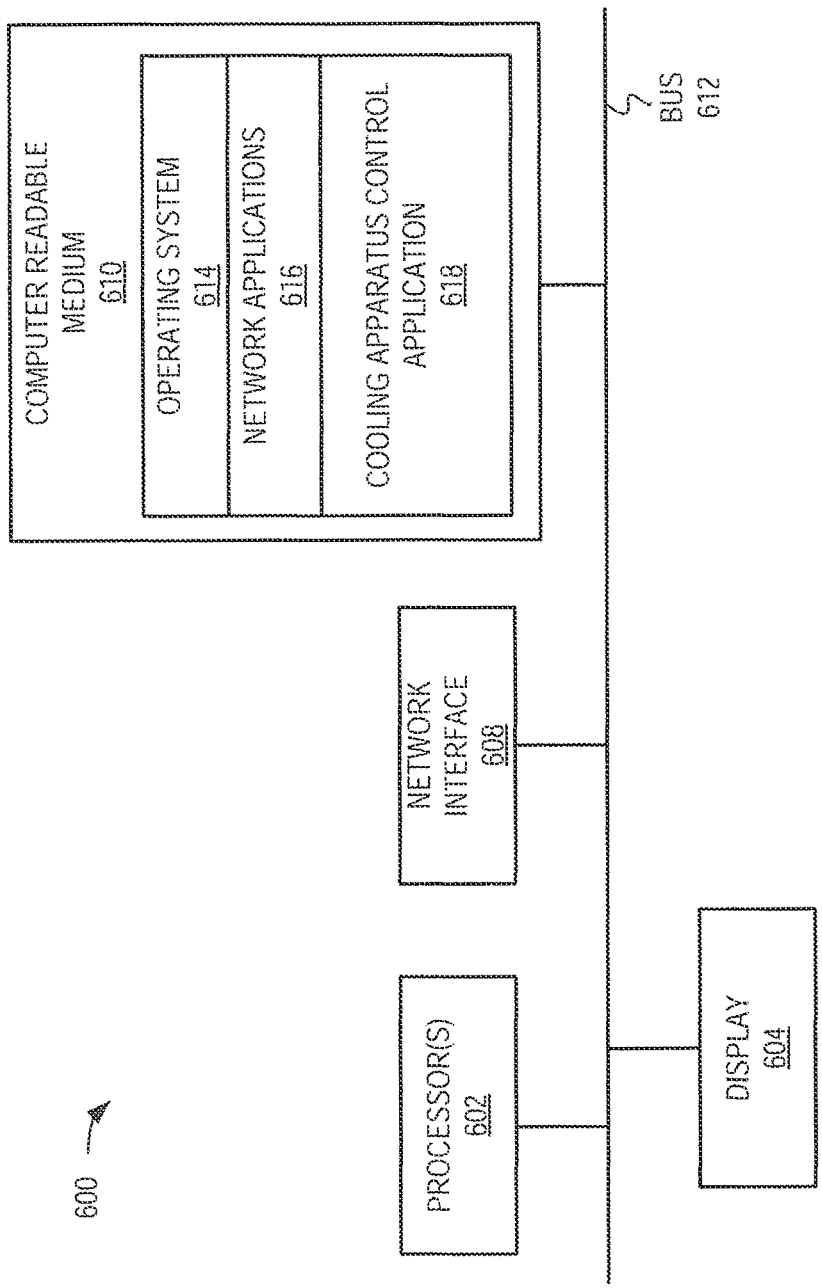
FIG. 6 illustrates a schematic representation of a computing device, which may be employed to perform various functions of the controller depicted in FIG. 2 and discussed with respect to FIG. 5, according to an example of the present disclosure.

Turning now to FIG. 6, there is shown a schematic representation of a computing device 600, which may be employed to perform various functions of the controller depicted in FIG. 2 and discussed with respect to the method 500 in FIG. 5, according to an example. The device 600 may include a processor 602, a display 604, such as a monitor; a network interface 608, such as a Local Area Network LAN, a wireless 802.11x LAN, a 3G mobile WAN or a WiMax WAN; and a computer-readable medium 610. Each of these components may be operatively coupled to a bus 612. For example, the bus 612 may be an EISA, a PCI, a USB, a FireWire, a NuBus, or a PDS.

The computer readable medium 610 may be any suitable medium that participates in providing instructions to the processor 602 for execution. For example, the computer readable medium 610 may be non-volatile media, such as an optical or a magnetic disk; volatile media, such as memory. The computer-readable medium 610 may also store an operating system 614, such as MS Windows, Unix, Linux, or Mac OS; network applications 616; and a cooling apparatus control application 618. The operating system 614 may be multi-user, multiprocessing, multitasking, multithreading, real-time and the like. The operating system 614 may also perform basic tasks such as recognizing input from input devices, such as a keyboard or a keypad; sending output to the display 604; keeping track of files and directories on the computer readable medium 610; controlling peripheral devices, such as disk drives, printers, image capture device; and managing traffic on the bus 612. The network applications 616 may include various components for establishing and maintaining network connections, such as machine-readable instructions for implementing communication protocols including TCP/IP, HTTP, Ethernet, USB, and FireWire.

The cooling apparatus control application 618 may provide various components for controlling the amount and/rate, at which droplets of cooling fluid are delivered by a cooling apparatus 114, 322, 332, as described above with respect to the method 500 in FIG. 5. The cooling apparatus control application 618 may thus determine amounts of heat that are to be respectively removed from each of a plurality of heat generating components 102, 302, 304 and control each of a plurality of cooling apparatuses 114, 322, 332 separately with respect to each other to respectively deliver droplets of cooling fluid to remove the determined amounts of heat from each of the plurality of heat generating components without substantially causing the cooling fluid to pool beneath the cooling apparatuses. In certain examples, some or all of the processes performed by the cooling apparatus control application 618 may be integrated into the operating system 614. In certain examples the processes may be at least partially implemented in digital electronic circuitry, or in computer hardware, machine-readable instructions (including firmware and/or software), or in any combination thereof.

Although described specifically throughout the entirety of the instant disclosure, representative examples of the present disclosure have utility over a wide range of applications, and the above discussion is not intended and should not be construed to be limiting, but is offered as an illustrative discussion of aspects of the disclosure.

What has been described and illustrated herein is an example of the disclosure along with some of its variations. The terms, descriptions and figures used herein are set forth by way of illustration only and are not meant as limitations. Many variations are possible within the spirit and scope of the disclosure, which is intended to be defined by the following claims—and their equivalents—in which all terms are meant in their broadest reasonable sense unless otherwise indicated.

What is claimed is:

1. An electronic apparatus comprising:
a heat generating component;
a cooling system having,
a cooling fluid reservoir;
a cooling apparatus in fluid communication with the cooling fluid reservoir;
a chamber having a side in thermal contact with a portion of the heat generating component, wherein the cooling apparatus is to deliver cooling fluid onto the side of the chamber, and wherein the cooling fluid is to be heated through receipt of heat from the heat generating component;
a cooling plate positioned at a distance and separated from the chamber; and
a cooling fluid tube connecting the chamber and the cooling plate, wherein the heated cooling fluid is to flow through the cooling fluid tube to the cooling plate, and wherein the cooling plate is to be in thermal contact with a heat exchanger that is to remove heat from the cooling fluid, wherein the cooling plate is in thermal contact with the heat exchanger and wherein the heated cooling fluid is to be cooled through transfer of heat to the coolant in the heat exchanger and wherein the cooled cooling fluid is to be returned to the cooling fluid reservoir.

2. The electronic apparatus according to claim 1, further comprising:
a second cooling fluid tube connecting the cooling plate to the cooling fluid reservoir, wherein at least one of the first cooling fluid tube and the second cooling fluid tube comprises a flexible tubing.

3. The electronic apparatus according to claim 1, further comprising:
a wicking apparatus positioned in the cooling fluid tube to wick the cooled cooling fluid from the cooling plate to the cooling fluid reservoir.

4. The electronic apparatus according to claim 1, further comprising:
a second heat generating component;
a second cooling system having,
a second cooling apparatus;
a second chamber having a side in thermal contact with a portion of the second heat generating component, wherein the second cooling apparatus is to deliver cooling fluid onto the side of the second chamber in thermal contact with the portion of the second heat generating component, and wherein the cooling fluid is to be heated through receipt of heat from the second heat generating component;
wherein the heated cooling fluid is to be cooled through transfer of heat into the coolant contained in the heat exchanger.

5. The electronic apparatus according to claim 4, wherein the heat generating component comprises at least one of a central processing unit and a graphics processing unit and the second heat generating component comprises a memory module.

6. The electronic apparatus according to claim 4, wherein the heat generating component extends along a first axis and the second heat generating component extends along a second axis that is substantially perpendicular to the first axis, and wherein the second cooling apparatus is to deliver the cooling fluid in a direction that is substantially perpendicular to the second axis.

7. The electronic apparatus according to claim 4, wherein the second chamber is in fluid communication with the cooling plate, said second cooling system further comprising:
a second return cooling fluid tube connecting the cooling plate and the second cooling apparatus; and
a valve positioned along the second return cooling fluid tube to control an amount of cooling fluid returned from the cooling plate to a second cooling fluid reservoir of the second cooling apparatus.

8. The electronic apparatus according to claim 1, further comprising:
a controller to control a rate at which the cooling apparatus delivers cooling fluid.

9. A system for cooling a heat generating component, said system comprising:
a cooling fluid reservoir;
a cooling apparatus in fluid communication with the cooling fluid reservoir;
a chamber having a side to be positioned in thermal contact with a portion of the heat generating component, wherein the cooling apparatus is to deliver a cooling fluid onto the side of the chamber, and wherein the cooling fluid is to be heated through receipt of heat from the heat generating component;
a cooling plate positioned at a distance and separated from the chamber;
a cooling fluid tube connecting the chamber in fluid communication with the cooling plate, wherein the heated cooling fluid is to flow into the cooling plate through the cooling fluid tube; and
a heat exchanger positioned in thermal contact with the cooling plate, the heat exchanger having a coolant to absorb heat from the heated cooling fluid, wherein the heated cooling fluid is to be cooled through transmission of heat into the coolant and wherein the cooled cooling fluid is to flow into the cooling fluid reservoir.

10. The system according to claim 9, wherein the heat exchanger is in thermal contact with a second cooling plate, which is separate from the cooling plate, the system further comprising:
a cooling device in fluid communication with the heat exchanger, wherein the cooling device is to receive and cool the coolant from the heat exchanger and to supply the cooled coolant to the heat exchanger, and wherein the cooling device and the heat exchanger form a substantially continuous loop that is separate from the chamber and the cooling plate.

11. The system according to claim 9, wherein the cooling apparatus further comprises:
a plurality of nozzles;
a plurality of actuators to dispense droplets of cooling fluid through the plurality of nozzle; and
a controller to control the plurality of actuators.

12. A method of cooling a plurality of heat generating components in an electronic apparatus using a plurality of cooling apparatuses, wherein each of the plurality of cooling apparatuses is to cool a respective one of the plurality of heat generating components, said method comprising:
determining amounts of heat that are to be respectively removed from each of the plurality of heat generating components, wherein the plurality of heat generating components comprise a first heat generating component and a second heat generating component, wherein the first heat generating component is to generate a higher amount of heat than the second heat generating component; and controlling, by a processor, each of the plurality of cooling apparatuses separately with respect to each other to respectively deliver cooling fluid to remove the determined amounts of heat from each of the plurality of heat generating components without substantially causing the cooling fluid to pool beneath the cooling apparatuses.

13. The method according to claim 12, wherein the cooling fluid is to be heated through absorption of heat from the heat generating components, wherein the cooling fluid is to be cooled in a cooling plate that is in thermal contact with a heat exchanger, and wherein the cooled cooling fluid is to be pumped to the plurality of cooling apparatuses by a pump, said method further comprising:

controlling the pump to vary the flow of the cooled cooling fluid such that each of the plurality of cooling apparatuses has access to sufficient amounts of the cooling fluid to remove the determined amounts of heat from each of the plurality of heat generating components.

14. The method according to claim 12, wherein the cooling fluid is to be heated through absorption of heat from the heat generating components, wherein the cooling fluid is to be cooled in a cooling plate that is in thermal contact with a heat exchanger, and wherein the cooled cooling fluid is to be returned to the plurality of cooling apparatuses through respective fluid tubes having respective valves positioned along the respective fluid tubes, said method further comprising:

controlling the valves to supply the return sufficient amounts of the cooled cooling fluid to each of the plurality of cooling apparatuses to enable the plurality of cooling apparatuses to remove the determined amounts of heat from each of the plurality of heat generating components.

* * * * *